(12) United States Patent
Hashimoto

(10) Patent No.: US 6,995,476 B2
(45) Date of Patent: Feb. 7, 2006

(54) SEMICONDUCTOR DEVICE, CIRCUIT BOARD AND ELECTRONIC INSTRUMENT THAT INCLUDE AN ADHESIVE WITH CONDUCTIVE PARTICLES THEREIN

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/486,561

(22) PCT Filed: Jun. 25, 1999

(86) PCT No.: PCT/JP99/03418

§ 371 (c)(1),
(2), (4) Date: Feb. 29, 2000

(87) PCT Pub. No.: WO00/02244

PCT Pub. Date: Jan. 13, 2000

(65) Prior Publication Data

US 2002/0053747 A1 May 9, 2002

(30) Foreign Application Priority Data

Jul. 1, 1998 (JP) ................................. 10-201246

(51) Int. Cl.
*H01L 23/28* (2006.01)
(52) U.S. Cl. ..................................... 257/787
(58) Field of Classification Search ............... 257/778, 257/777, 780, 782, 783, 737, 787; 156/89.16, 156/229, 322, 299; 438/118, 119; 29/832
See application file for complete search history.

(56) References Cited

U.S. PATENT DOCUMENTS

| 4,749,120 A | * | 6/1988 | Hatada ................... 228/123.1 |
|---|---|---|---|
| 5,115,545 A | * | 5/1992 | Fujimoto et al. .......... 29/25.01 |
| 5,578,527 A | | 11/1996 | Chang et al. |
| 5,677,246 A | * | 10/1997 | Maeta et al. ................. 438/118 |
| 5,783,465 A | * | 7/1998 | Canning et al. ............. 438/119 |
| 5,804,882 A | * | 9/1998 | Tsukagoshi et al. ........ 257/783 |
| 5,864,178 A | * | 1/1999 | Yamada et al. .............. 257/737 |
| 5,886,399 A | * | 3/1999 | Ohsawa et al. ............. 257/668 |
| 6,040,631 A | * | 3/2000 | Dibble et al. ................ 257/783 |
| 6,049,124 A | * | 4/2000 | Raiser et al. ................ 257/712 |
| 6,077,382 A | * | 6/2000 | Watanabe .................... 156/322 |
| 6,312,551 B1 | * | 11/2001 | Murayama et al. .......... 156/295 |
| 6,322,936 B1 | | 11/2001 | Nishikawa et al. |
| 6,353,182 B1 | * | 3/2002 | Chang et al. ............... 174/52.2 |
| 6,407,461 B1 | * | 6/2002 | Farquhar et al. ............ 257/787 |
| 6,426,166 B2 | | 7/2002 | Nishikawa et al. |
| 6,528,889 B1 | * | 3/2003 | Matsuhira et al. .......... 257/778 |

FOREIGN PATENT DOCUMENTS

| JP | 61-156239 | 9/1986 |
|---|---|---|
| JP | 5-72402 | 3/1993 |
| JP | 7-49413 | 2/1995 |
| JP | 7-312377 | 11/1995 |

(Continued)

OTHER PUBLICATIONS

Webster's Ninth New Collegiate Dictionary, 1987, p. 1176.*

*Primary Examiner*—David A. Zarneke
(74) *Attorney, Agent, or Firm*—Oliff & Berridge, PLC

(57) ABSTRACT

A method of manufacturing a semiconductor device, comprising: a first step of interposing an anisotropic conductive material 16 between a surface 18 of a substrate 12 on which an interconnect pattern 10 is formed, and a surface 24 of a semiconductor chip 20 on which electrodes 22 is formed; and a second step in which pressure is applied between the semiconductor chip 20 and the substrate 12, the interconnect pattern 10 and electrodes 22 are electrically connected, and the anisotropic conductive material 16 is caused to surround at least a part of a lateral surface 28 of the semiconductor chip 20.

11 Claims, 7 Drawing Sheets

FOREIGN PATENT DOCUMENTS

| | | |
|---|---|---|
| JP | 10-4126 | 1/1998 |
| JP | 10-84014 | 3/1998 |
| JP | A-10-084014 | 3/1998 |
| JP | 10-116855 | 5/1998 |
| JP | 10-125725 | 5/1998 |
| JP | A-10-125725 | 5/1998 |
| JP | 2000-21935 | 1/2000 |
| JP | 2000-22329 | 1/2000 |
| WO | WO 98/10334 | 3/1998 |
| WO | WO 98/37444 | 8/1998 |

* cited by examiner

SEMICONDUCTOR DEVICE, CIRCUIT BOARD AND ELECTRONIC INSTRUMENT THAT INCLUDE AN ADHESIVE WITH CONDUCTIVE PARTICLES THEREIN

TECHNICAL FIELD

The present invention relates to a semiconductor device and method of manufacture thereof, and to a circuit board and an electronic instrument.

BACKGROUND ART

In recent years, with the increasing compactness of electronic instruments, semiconductor device packages adapted to high density mounting are in demand. In response to this, surface mounting packages such as a ball grid array (BGA) and a chip scale/size package (CSP) have been developed. In a surface mounting package, a substrate may be used which has formed thereon an interconnect pattern for connection to a semiconductor chip.

In a surface mounting package, there is a requirement to prevent the formation of a gap between the semiconductor chip and substrate, and subsequent ingress of moisture.

The present invention solves this problems, and has as its objective the provision of a method of manufacturing a semiconductor device and a semiconductor device manufactured by said method, of a circuit board and of an electronic instrument, having excellent reliability and productivity.

DISCLOSURE OF THE INVENTION (1) A method of manufacturing a semiconductor device of the present invention comprises:

a first step of interposing an adhesive between a surface of a substrate on which an interconnect pattern is formed and a surface of a semiconductor chip on which electrodes are formed; and a second step in which pressure is applied between the semiconductor chip and the substrate, the interconnect pattern and the electrodes are electrically connected, and the adhesive is caused to surround at least a part of a lateral surface of the semiconductor chip.

Since the adhesive covers at least a part of the lateral surface of the semiconductor chip, not only is the semiconductor chip protected from mechanical damage, but also water can be prevented from reaching the electrodes, and corrosion can be prevented.

(2) In this method of manufacturing a semiconductor device, the adhesive may be provided in the first step at a thickness greater than the interval between the semiconductor chip and the substrate after the second step, and be spread out beyond the semiconductor chip by applying pressure between the semiconductor chip and the substrate in the second step.

(3) In this method of manufacturing a semiconductor device, the adhesive may be formed so as to substantially cover the lateral surface of the semiconductor chip.

(4) In this method of manufacturing a semiconductor device, the interconnect pattern and the electrodes may be electrically connected by conductive particles dispersed in the adhesive.

Since the interconnect pattern and the electrodes are electrically connected by the conductive particles, a semiconductor device can be manufactured by a method having excellent reliability and productivity.

(5) In this method of manufacturing a semiconductor device, before the first step, the adhesive may be previously disposed on the surface of the semiconductor chip on which the electrodes are formed.

(6) In this method of manufacturing a semiconductor device, before the first step, the adhesive may be previously disposed on the surface of the substrate on which the interconnect pattern is formed.

(7) In this method of manufacturing a semiconductor device, the adhesive may include a shading material.

Since the adhesive includes a shading material, light can be prevented from reaching the surface of the semiconductor chip having the electrodes, and so malfunction of the semiconductor chip can be prevented.

(8) A semiconductor device of the present invention comprises a semiconductor chip having electrodes, a substrate having an interconnect pattern, and an adhesive;

wherein the electrodes and the interconnect pattern are electrically connected; and wherein the adhesive is interposed between a surface of the substrate on which the interconnect pattern is formed and a surface of the semiconductor chip on which the electrodes are formed, so as to cover at least a part of a lateral surface of the semiconductor chip.

Since the adhesive covers at least a part of a lateral surface of the semiconductor chip, the semiconductor chip is protected from mechanical damage. Additionally, since the semiconductor chip is covered by the adhesive as far as a position remote from the electrodes, water can be prevented from reaching the electrodes, and corrosion of the electrodes can be prevented.

(9) In this semiconductor device, the adhesive may be formed so as to substantially cover the lateral surface of the semiconductor chip.

(10) In this semiconductor device, conductive particles may be dispersed in the adhesive to form an anisotropic conductive material.

Since the interconnect pattern and electrodes are electrically connected by the anisotropic conductive material, the reliability and productivity are excellent.

(11) In this semiconductor device, the anisotropic conductive material may be provided to cover the whole of the interconnect pattern.

(12) In this semiconductor device, the adhesive may include a shading material.

Since the adhesive includes a shading material, light can be prevented from reaching the surface of the semiconductor chip having the electrodes, and so malfunction of the semiconductor chip can be prevented.

(13) A semiconductor device according to the present invention is manufactured by the above-described method.

(14) On a circuit board according to the present invention, the above-described semiconductor device is mounted.

(15) An electronic instrument according to the present invention has the above-described circuit board.

BEST MODE FOR CARRYING OUT THE INVENTION

Figure 5A:
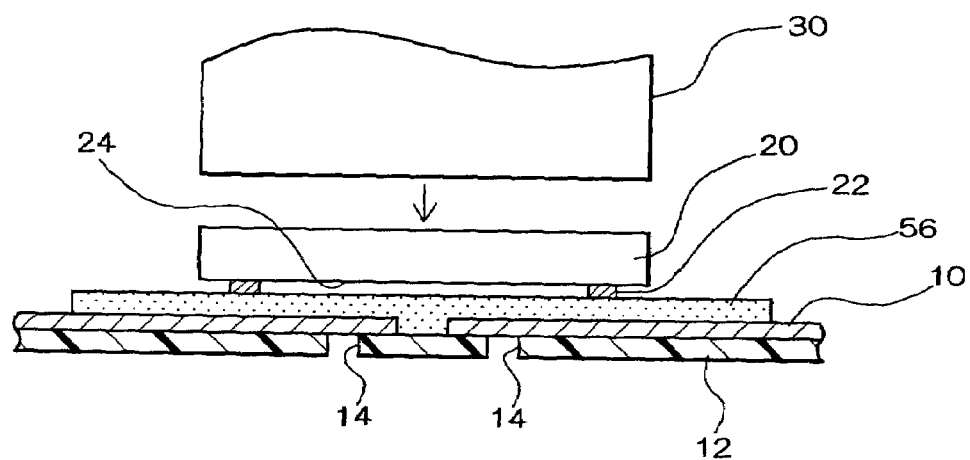
FIGS. 5A and 5B show a method of manufacturing a semiconductor device in accordance with an embodiment of the present invention.
Figure 5B:
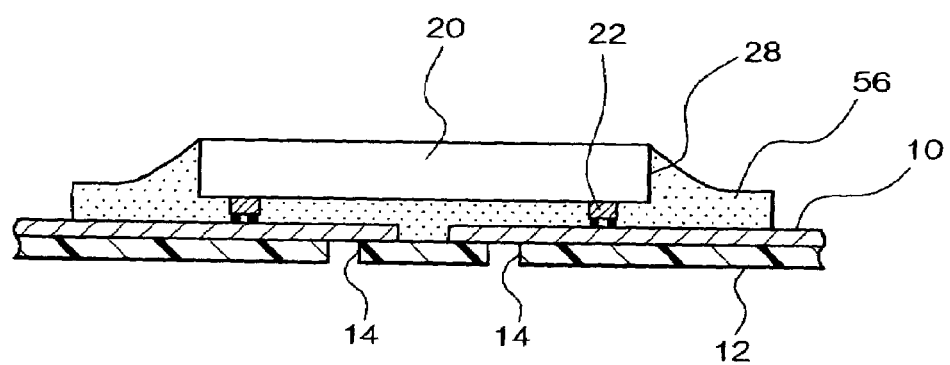

A preferred embodiment of the present invention will be described, with reference to the drawings. An embodiment of the present invention is shown in FIGS. 5A and 5B. There are also some reference techniques which can be applied to the embodiment of the present invention.

First Reference Technique

Figure 1:
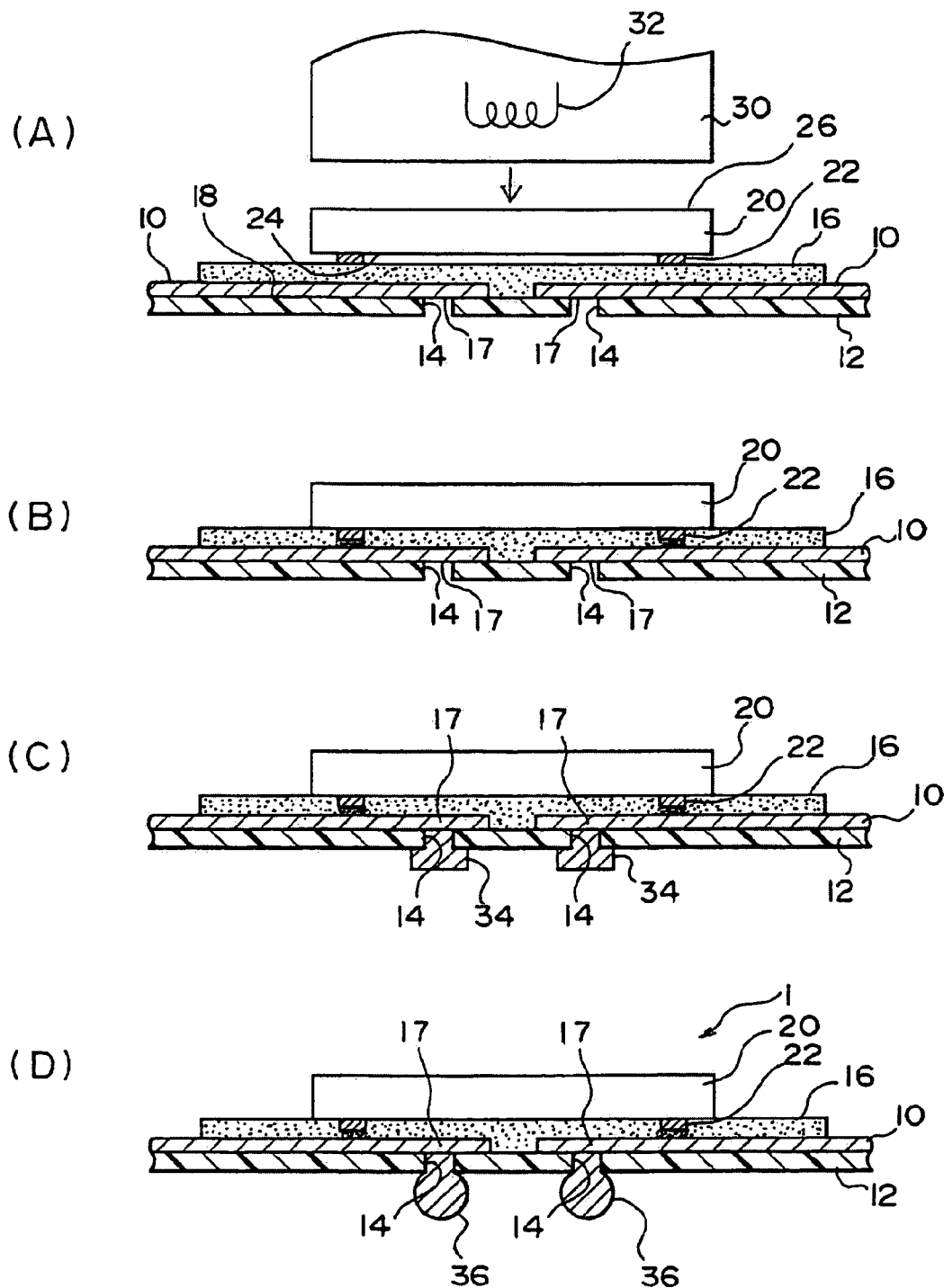
FIGS. 1A to 1D show a method of manufacturing a semiconductor device in accordance with a first reference technique relating to the present invention.

A method of manufacturing a semiconductor device in accordance with the first reference technique is shown in FIGS. 1A to 1D. In this reference technique, a substrate 12 is used which has an interconnect pattern 10 formed on at least one surface 18, as shown in FIG. 1A.

The substrate 12 may be a flexible substrate formed of an organic material, a metal substrate formed of an inorganic material, or a combination of these. As a flexible substrate may be used a tape carrier. If the electric conductivity of the substrate 12 is high, an insulating film is formed between the substrate 12 and the interconnect pattern 10 and on inner surfaces of through holes 14. In addition, the insulating film may also be formed on a surface of the substrate opposite to the surface on which the interconnect pattern 10 is formed.

The through holes 14 are formed in the substrate 12, and the interconnect pattern 10 is formed on the substrate, covering the through holes 14. Lands 17 for external electrodes are formed over the through holes 14, as part of the interconnect pattern 10.

An anisotropic conductive material 16, as one example of an adhesive, is provided on a thus obtained substrate 12. In the description that follows, an anisotropic conductive material is given as an example of an adhesive. The anisotropic conductive material 16 comprises an adhesive (binder) in which are dispersed conductive particles (conductive filler), and in some cases a dispersant is added. The anisotropic conductive material 16 could be previously formed as a sheet that is affixed to the substrate 12, or it could equally well be provided as a liquid on the substrate 12. The anisotropic conductive material 16 may be provided to be larger than a surface 24 of a semiconductor chip 20 on which electrodes 22 are provided, or may be provided in a quantity to be smaller than the surface 24, then compressed so as to spread out beyond the surface 24.

Alternatively, the anisotropic conductive material 16 may be provided on the surface 24 of the semiconductor chip 20, in a quantity to be compressed so as to spread out beyond the surface 24. It should be noted that even if an adhesive not including conductive particles is used, the electrodes 22 and interconnect pattern 10 can be electrically connected.

In this reference technique, a thermosetting adhesive is used as the anisotropic conductive material, and the anisotropic conductive material 16 may further include a shading material. As a shading material can be used, for example, a black dye or black pigment dispersed in an adhesive resin.

As the adhesive may be used a thermosetting adhesive as typified by an epoxy type, or a photocurable adhesive as typified by an epoxy or acrylate type. Further, the type of adhesive cured by electron beam, or a thermoplastic (thermal adhesion) type of adhesive may equally be used. In the following description, if an adhesive other than thermosetting is used, the provision of energy should be substituted in place of the application of heat or pressure.

Next, the semiconductor chip 20 is mounted on the anisotropic conductive material 16, for example. In more detail, the semiconductor chip 20 is mounted such that the surface 24 of the semiconductor chip 20 on which the electrodes 22 are formed faces the anisotropic conductive material 16. Moreover, the semiconductor chip 20 is disposed so that the each electrode 22 is positioned over a land (not shown in the figures) for connection of the electrodes to the interconnect pattern 10. It should be noted that the semiconductor chip 20 may have the electrodes 22 formed on two edges only, or may have the electrodes 22 formed on four edges. The electrodes 22 are commonly in the form of projections made of gold, solder or the like provided on aluminum pads. The electrodes 22 may be formed on the interconnect pattern 10 side in the form of such projections or projections formed by etching the interconnect pattern 10.

By means of the above process, the anisotropic conductive material 16 is positioned between the surface 24 of the semiconductor chip 20 on which the electrodes 22 are formed and the surface 18 of the substrate 12 on which the interconnect pattern 10 is formed. A jig 30 is then used to press a surface 26 of the semiconductor chip 20 which is opposite to the surface 24 on which the electrodes 22 are formed such that the semiconductor chip 20 is subjected to pressure in the direction of the substrate 12. Alternatively, pressure may be applied between the semiconductor chip 20 and the substrate 12. Even if the anisotropic conductive material 16 as an adhesive is provided within the area of the surface 24 of the semiconductor chip 20, the applied pressure causes it to spread out beyond the surface 24. The jig 30 has an internal heater 32, and applies heat to the semiconductor chip 20. It should be noted that considering the requirement as far as possible to apply heat also to the spread out portion of the anisotropic conductive material 16, the jig 30 used preferably has a greater plan area than the plan area of the semiconductor chip 20. In this way, heat can easily be applied to the periphery of the semiconductor chip 20.

Thus, as shown in FIG. 1B, the electrodes 22 of the semiconductor chip 20 and the interconnect pattern 10 are electrically connected through the conductive particles of the anisotropic conductive material 16. According to this reference technique, since the interconnect pattern 10 and electrodes 22 are electrically connected through the anisotropic conductive material 16, a semiconductor device can be manufactured by a method of excellent reliability and productivity.

Since heat is applied to the semiconductor chip 20 by the jig 30, the anisotropic conductive material 16 is cured in the region of contact with the semiconductor chip 20. In the region not contacting the semiconductor chip 20 or the region apart from the semiconductor chip 20, heat does not reach the anisotropic conductive material 16, so that the curing is incomplete. The curing of these regions is carried out in the following step.

As shown in FIG. 1C, solder 34 is provided within and around the periphery of the through holes 14 in the substrate 12. A cream solder or the like may be used to form the solder 34 by printing. Alternatively, pre-formed solder balls may be mounted in the above-described position.

The solder 34 is then heated in a reflow step, and solder balls 36 are formed as shown in FIG. 1D. The solder balls 36 function as external electrodes. In this reflow step, not only the solder 34 but also the anisotropic conductive material 16 is heated. This heat cures the regions of the anisotropic conductive material 16 which are not yet cured. That is to say, of the anisotropic conductive material 16, the region not contacting the semiconductor chip 20 or the region apart from the semiconductor chip 20, is cured in the reflow step of forming the solder balls 36.

In the thus obtained semiconductor device 1, since the whole of the anisotropic conductive material 16 is cured, the possibility of the anisotropic conductive material 16 around the semiconductor chip 20 coming apart from the substrate 12 and allowing the ingress of water, leading to migration of the interconnect pattern 10 is prevented. Since the whole of the anisotropic conductive material 16 is cured, the inclusion of water within the anisotropic conductive material 16 can also be prevented.

Further in the semiconductor device 1, since the electrodes 22 provided on the surface 24 of the semiconductor chip 20 are covered by the anisotropic conductive material 16 which includes a shading material, light can be prevented from reaching this surface 24. Therefore, malfunction of the semiconductor chip 20 can be prevented.

Figure 2A:
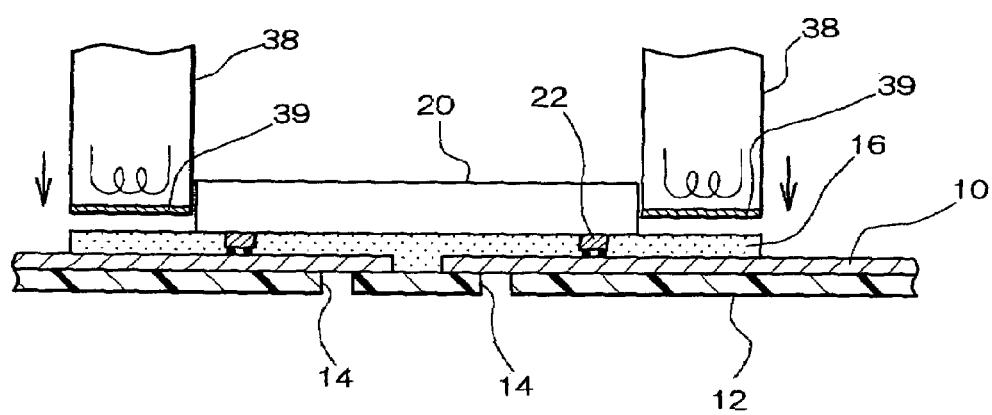
FIGS. 2A and 2B show a modification of the first reference technique.
Figure 2B:
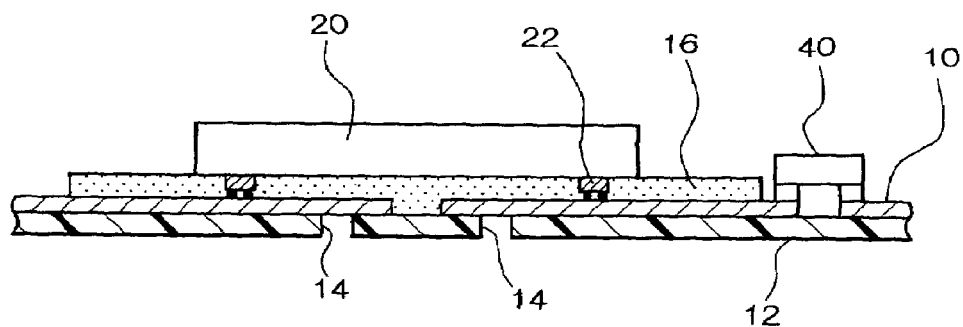

FIGS. 2A and 2B show modifications of the first reference technique. In these modifications, the structure which is the same as in the first reference technique is indicated by the same reference numerals, and description of this structure and the effect of this structure is omitted. The same is true for the following.

The step shown in FIG. 2A can be carried out after the step of FIG. 1B and before the step of FIG. 1C. In more detail, of the anisotropic conductive material 16, the region not contacting the semiconductor chip 20 and the region apart from the semiconductor chip 20, are heated by a heating jig 38. The heating jig 38 is preferably provided with a nonadhesive layer 39 formed of Teflon or the like having high nonadhesive properties to the anisotropic conductive material 16 that is an example of an adhesive, so that uncured anisotropic conductive material 16 does not adhere thereto. Alternatively, the nonadhesive layer 39 may be provided on the anisotropic conductive material 16 that is an example of an adhesive. Further, the anisotropic conductive material 16 as an example of an adhesive may be heated by a non-contact method. By this means, of the anisotropic conductive material 16, the region not contacting the semiconductor chip 20 and the region apart from the semiconductor chip 20 can be cured. In place of a jig, a hot air blower or optical heater capable of localized heating may be used.

Alternatively, as shown in FIG. 2B, after the step of FIG. 1B and before the step of FIG. 1C, a reflow step may be carried out to electrically connect an electronic component 40 distinct from the semiconductor chip 20 to the interconnect pattern 10. By means of this reflow step, of the anisotropic conductive material 16, the region not contacting the semiconductor chip 20 and the region apart from the semiconductor chip 20 is heated and cured. It should be noted that as the electronic component 40 may be cited for example a resistor, capacitor, coil, oscillator, filter, temperature sensor, thermistor, varistor, variable resistor, or a fuse.

According to these modifications, all of the anisotropic conductive material 16 can be cured, and the possibility of the anisotropic conductive material 16 coming apart from the substrate 12 and allowing the ingress of water, leading to migration of the interconnect pattern 10 can be prevented. Since the whole of the anisotropic conductive material 16 is cured, the inclusion of water can also be prevented.

After the above described steps, the substrate 12 may be cut in the region in which the anisotropic conductive material 16 being an example of an adhesive spreads beyond the semiconductor chip 20.

This reference technique has been described with a substrate with interconnects on one surface only as the substrate 12, but is not limited to this, and a double-sided interconnect substrate or multi-layer interconnect may be used. In this case, in stead of disposing solder in the through holes, solder balls may be formed on lands provided on the surface opposite to that on which the semiconductor chip is mounted. In place of solder balls other conductive projections may be used. The connection between the semiconductor chip and the substrate may be carried out by wire bonding. These observations apply equally to the following.

In this reference technique, not only a thermosetting adhesive, but also an anisotropic conductive material 16 being an example of a thermoplastic adhesive may be used. A thermoplastic adhesive can be hardened by cooling. Alternatively, an adhesive which can be hardened by radiation such as ultraviolet may be used. This applies equally to the following.

Second Reference Technique

Figure 3A:
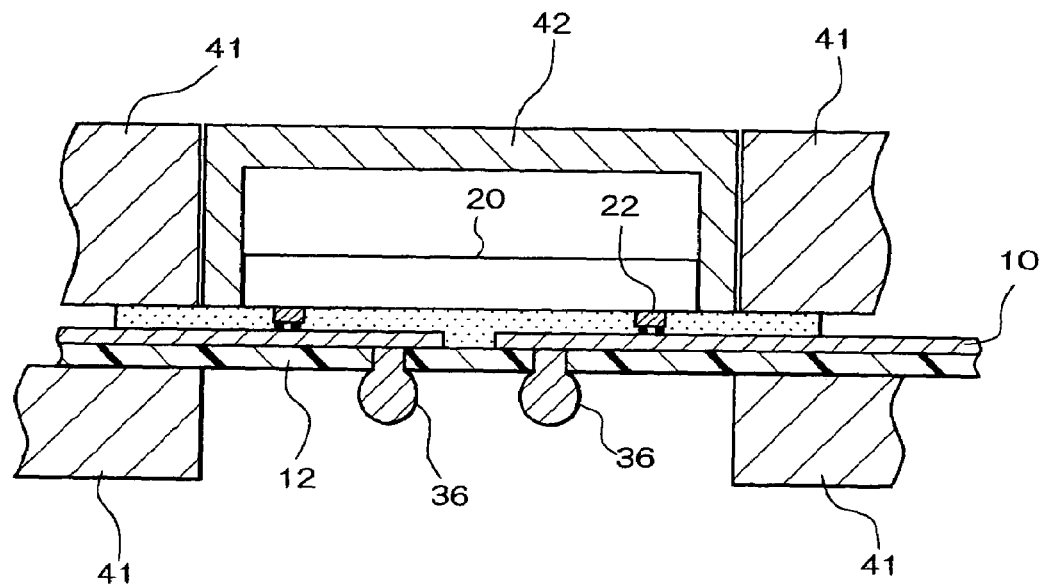
FIGS. 3A and 3B show a method of manufacturing a semiconductor device in accordance with a second reference technique relating to the present invention.
Figure 3B:
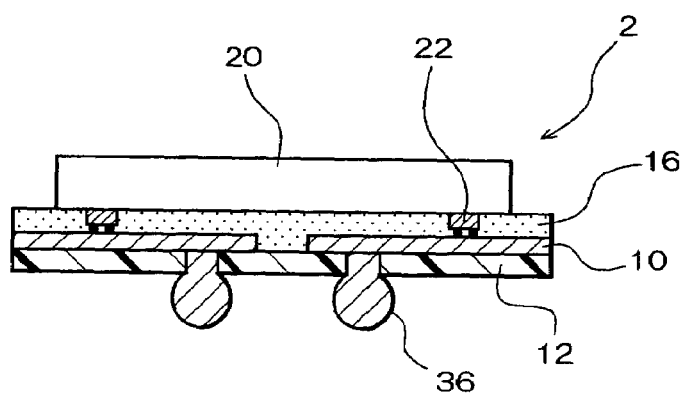

A method of manufacturing a semiconductor device in accordance with the second reference technique is shown in FIGS. 3A and 3B. This reference technique is carried out following on from the first reference technique.

More specifically, in this reference technique, following on from the step of FIG. 1D, the anisotropic conductive material 16 and substrate 12 are held by a fixed blade 41, and cut by a movable blade 42 to a size slightly larger than the semiconductor chip 20, as shown in FIG. 3A, yielding a semiconductor device 2 shown in FIG. 3B. The cutting means is not limited thereto, and any other available cutting means and holding means can be applied. Since the substrate 12 is cut together with the anisotropic conductive material 16, the cut through the two is coplanar, and the entire surface of the substrate 12 is covered by the anisotropic conductive material 16. Therefore, the interconnect pattern 10 is not exposed, and moisture is prevented from reaching the interconnect pattern 10 and causing migration.

According to this reference technique, since the anisotropic conductive material 16 is cut, it does not require to be previously cut to the same size as the semiconductor chip 20 or slightly larger, and accurate positioning with respect to the semiconductor chip 20 is not required.

It should be noted that this reference technique is an example of the anisotropic conductive material 16 and substrate 12 being cut after the solder balls 36 are formed, but the timing of the cut is independent of the formation of the solder balls 36, as long as it is at least after the semiconductor chip 20 has been mounted on the anisotropic conductive material 16. However, the anisotropic conductive material 16 is preferably cured at least in the region of contact with the semiconductor chip 20. In this case, mispositioning of the semiconductor chip 20 and interconnect pattern 10 can be prevented. If the anisotropic conductive material 16 is cured rather than uncured in the location of the cut, the cutting operation will be easier.

It should be noted that when the substrate 12 is cut, the whole of the anisotropic conductive material 16 being an example of an adhesive may be cured in a single operation. For example, when the electrodes 22 of the semiconductor chip 20 and the interconnect pattern 10 are electrically connected, heat may be applied or cooling applied to the whole of the anisotropic conductive material 16 being an example of an adhesive. When a thermosetting adhesive is used, a jig may be used which contacts both of the semiconductor chip 20 and the adhesive spreading out beyond the semiconductor chip 20. Alternatively, heating may be applied by means of an oven.

Third Reference Technique

Figure 4A:
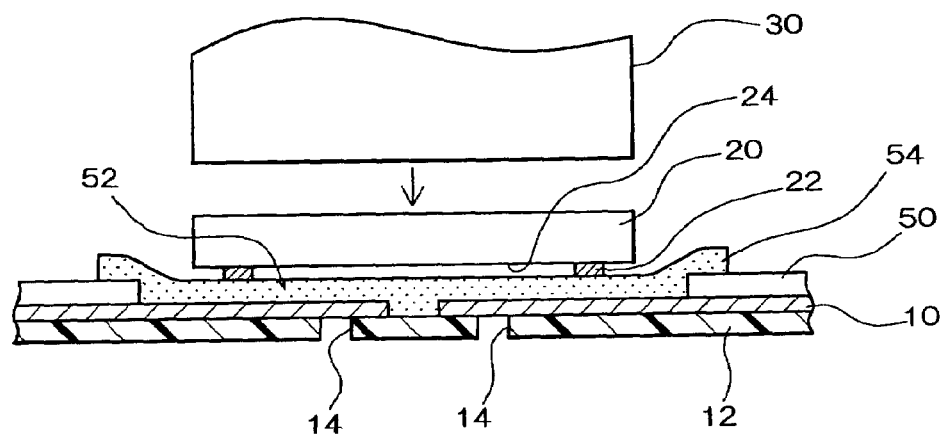
FIGS. 4A and 4B show a method of manufacturing a semiconductor device in accordance with a third reference technique relating to the present invention.
Figure 4B:
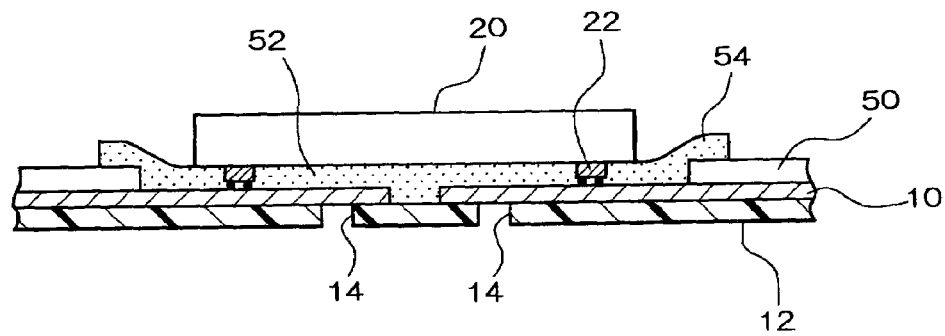

A method of manufacturing a semiconductor device in accordance with the third reference technique is shown in FIGS. 4A and 4B. In this reference technique, the substrate 12 of the first reference technique is used, and on the substrate 12 is formed a protective layer 50. The protective layer 50 is such as to cover the interconnect pattern 10, preventing contact with water, and for example solder resist may be used.

The protective layer 50 is formed around a region 52 that is larger in extent than the region in which the semiconductor chip 20 is mounted on the substrate 12. That is to say, the region 52 is larger than the surface 24 of the semiconductor chip 20 having the electrodes 22, and within this region 52 the lands (not shown in the drawings) for connection to the electrodes 22 of the semiconductor chip 20 are formed on the interconnect pattern 10. Alternatively, the protective layer 50 may be formed to avoid at least portions for electrical connection to the electrodes 20 of the semiconductor chip 20.

On such a substrate 12 an anisotropic conductive material 54 (adhesive) of a material which can be selected as the anisotropic conductive material 16 of the first reference technique is provided. It should be noted that the anisotropic conductive material 54 does not necessarily contain a shading material, but if it does contain a shading material then the same effect as in the first reference technique is obtained.

In this reference technique, the anisotropic conductive material 54 is provided from the region of mounting of the semiconductor chip 20 to the protective layer 50. That is to say, the anisotropic conductive material 54 covers the interconnect pattern 10 and substrate 12 in the region 52 in which the protective layer 50 is not formed, and is also formed to overlap the edge of the protective layer 50 surrounding the region 52. Alternatively, the anisotropic conductive material 54 being an example of an adhesive may be provided on the semiconductor chip 20 side. In more detail, the description in the first reference technique applies.

The semiconductor chip 20 is then pressed toward the substrate 12 and heat is applied by the jig 30, as shown in FIG. 4A. Alternatively, pressure is applied at least between the semiconductor chip 20 and the substrate 12. In this way, the electrodes 22 of the semiconductor chip 20 and the interconnect pattern 10 are electrically connected, as shown in FIG. 4B. Thereafter, in the same way as in the steps shown in FIGS. 1C and 1D, solder balls are formed, and the semiconductor device is obtained.

According to this reference technique, the anisotropic conductive material 54 is not only formed in the region 52 in which the protective layer 50 is not formed, but also formed to overlap the edge of the protective layer 50 surrounding the region 52. Consequently, there is no gap between the anisotropic conductive material 54 and the protective layer 50, and the interconnect pattern 10 is not exposed, so that migration can be prevented.

It should be noted that in this reference technique, it is preferable that the anisotropic conductive material 54 is cured also in the region spreading beyond the semiconductor chip 20. This curing step can be carried out in the same way as in the first reference technique.

Embodiment

A method of manufacturing a semiconductor device in accordance with one embodiment of the present invention is shown in FIGS. 5A and 5B. In this embodiment, the substrate 12 of the first reference technique is used, and an anisotropic conductive material 56 (adhesive) is provided on the substrate 12. The difference between this embodiment and the first reference technique is in that the thickness of the anisotropic conductive material 56 may be different. That is to say, as shown in FIG. 5A, in this embodiment the thickness of the anisotropic conductive material 56 is greater than the thickness of the anisotropic conductive material 16 shown in FIG. 1A. More specifically, the anisotropic conductive material 56 is thicker than the interval between the surface 24 of the semiconductor chip 20 having the electrodes 22 and the interconnect pattern 10 formed on the substrate 12. The anisotropic conductive material 56 is at least slightly larger than the semiconductor chip 20. It should be noted that it is sufficient for either of these thickness and size conditions to be satisfied.

As shown in FIG. 5A, the semiconductor chip 20 is then pressed toward the substrate 12 and heat is applied by the jig 30, for example. By doing this, the anisotropic conductive material 56 surrounds a part or all of a lateral surface 28 of the semiconductor chip 20, as shown in FIG. 5B. Thereafter, solder balls are formed in the same way as in the steps shown in FIGS. 1C and 1D, and the semiconductor device is obtained.

According to this embodiment, since at least part of the lateral surface 28 of the semiconductor chip 20 are covered by the anisotropic conductive material 56, the semiconductor chip 20 is protected from mechanical damage. Moreover, since the anisotropic conductive material 56 covers as far as a position removed from the electrodes 22, corrosion of the electrodes 22 and so on can be prevented.

Although the above embodiment has been described principally in terms of a chip size/scale package (CSP) of face-down bonding (FDB), the present invention can be applied to any semiconductor device to which FDB is applied, such as a semiconductor device to which Chip on Film (COF) or Chip on Board (COB) is applied, or the like.

Figure 6:
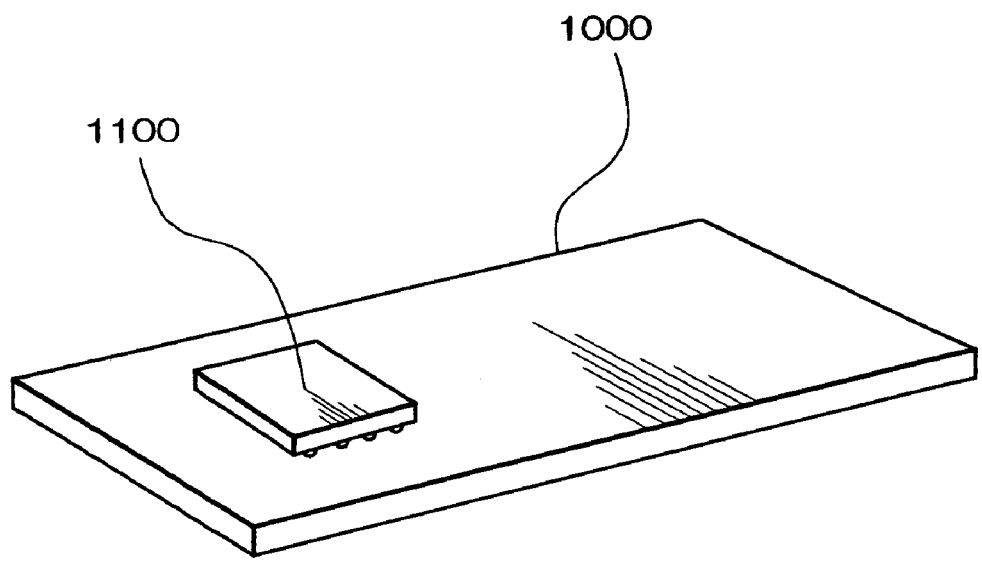
FIG. 6 shows a circuit board on which is mounted a semiconductor device in accordance with the embodiment of the present invention.

A circuit board 1000 on which is mounted a semiconductor device 1100 fabricated by the method of the above described embodiment is shown in FIG. 6. An organic substrate such as a glass epoxy substrate or the like is generally used for the circuit board 1000. On the circuit board 1000, an interconnect pattern of for example copper is formed to provide a desired circuit. Then electrical connection is achieved by mechanical connection of the interconnect pattern and external electrodes of the semiconductor device 1100.

It should be noted that the semiconductor device 1100 has a mounting area which can be made as small as the area for mounting a bare chip, and therefore when this circuit board 1000 is used in an electronic instrument, the electronic instrument itself can be made more compact. Moreover, a larger mounting space can be obtained within the same area, and therefore higher functionality is possible.

Figure 7:
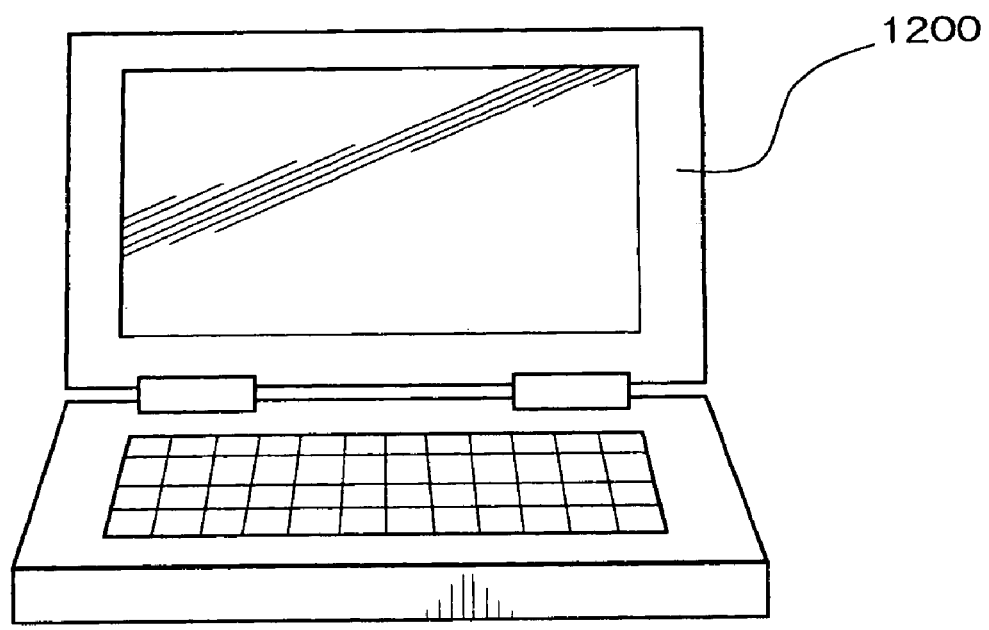
FIG. 7 shows an electronic instrument having a circuit board on which is mounted a semiconductor device in accordance with the embodiment of the present invention.

Then as an example of an electronic instrument equipped with this circuit board 1000, a notebook personal computer 1200 is shown in FIG. 7.

It should be noted that, whether active components or passive components, the present invention can be applied to various surface-mounted electronic components. As electronic components, for example, may be cited resistors, capacitors, coils, oscillators, filters, temperature sensors, thermistors, varistors, variable resistors, and fuses.

What is claimed is:

1. A semiconductor device, comprising:
   a semiconductor chip having electrodes;
   a substrate having an interconnect pattern;
   an adhesive, said adhesive having a first portion and a second portion, said first portion interposed between a surface of said substrate on which said interconnect pattern is formed and a surface of said semiconductor chip on which said electrodes are formed, said second portion not overlapping with said semiconductor chip; and
   conductive particles dispersed in said adhesive;
   wherein said electrodes and said interconnect pattern are electrically connected via at least part of said conductive particles; and
   wherein said second portion of said adhesive covers all area of lateral surfaces of said semiconductor chip that is substantially perpendicular to the surface of the semiconductor chip on which the electrodes are formed, and a thickness of any part of said second portion of said adhesive is thicker than an interval between the surface of the semiconductor chip on which said electrodes are formed and said interconnect pattern on said substrate.

2. The semiconductor device as defined in claim 1, wherein said adhesive is provided to cover said interconnect pattern in its entirety.

3. The semiconductor device as defined in claim 1, wherein said adhesive includes a shading material.

4. The semiconductor device as defined in claim 1, wherein at least a part of said adhesive has a thickness substantially the same as said semiconductor chip.

5. The semiconductor device as defined in claim 1, wherein said second portion of said adhesive has part of said conductive particles dispersed therein.

6. A circuit board on which is mounted a semiconductor device, the semiconductor device comprising:
   a semiconductor chip having electrodes;
   a substrate having an interconnect pattern;
   an adhesive, said adhesive having a first portion and a second portion, said first portion interposed between a surface of said substrate on which said interconnect pattern is formed and a surface of said semiconductor chip on which said electrodes are formed, said second portion not overlapping with said semiconductor chip; and
   conductive particles dispersed in said adhesive;
   wherein said electrodes and said interconnect pattern are electrically connected via at least part of said conductive particles; and
   wherein said second portion of said adhesive covers all area of lateral surfaces of said semiconductor chip that is substantially perpendicular to the surface of the semiconductor chip on which the electrodes are formed, and a thickness of any part of said second portion of said adhesive is thicker than an interval between the surface of the semiconductor chip on which said electrodes are formed and said interconnect pattern on said substrate.

7. The circuit board as defined in claim 6,
   wherein a part of said adhesive covering all area of lateral surfaces of said semiconductor chip has a thickness substantially the same as said semiconductor chip.

8. The circuit board as defined in claim 6,
   wherein said second portion of said adhesive has part of said conductive particles dispersed therein.

9. An electronic instrument having a semiconductor device, the semiconductor device comprising:
   a semiconductor chip having electrodes;
   a substrate having an interconnect pattern;
   an adhesive, said adhesive having a first portion and a second portion, said first portion interposed between a surface of said substrate on which said interconnect pattern is formed and a surface of said semiconductor chip on which said electrodes are formed, said second portion not overlapping with said semiconductor chip; and
   conductive particles dispersed in said adhesive;
   wherein said electrodes and said interconnect pattern are electrically connected via at least part of said conductive particles; and
   wherein said second portion of said adhesive covers all area of lateral surfaces of said semiconductor chip that is substantially perpendicular to the surface of the semiconductor chip on which the electrodes are formed, and a thickness of any part of said second portion of said adhesive is thicker than an interval between the surface of the semiconductor chip on which said electrodes are formed and said interconnect pattern on said substrate.

10. The electronic instrument as defined in claim 9,
    wherein a part of said adhesive covering all area of lateral surfaces of said semiconductor chip has a thickness substantially the same as said semiconductor chip.

11. The electronic instrument as defined in claim 9,
    wherein said second portion of said adhesive has part of said conductive particles dispersed therein.

* * * * *